US007177775B2

(12) United States Patent
Kapur et al.

(10) Patent No.: US 7,177,775 B2
(45) Date of Patent: Feb. 13, 2007

(54) TESTABLE DIGITAL DELAY LINE

(75) Inventors: Mohit Kapur, Mount Kisco, NY (US); Seongwon Kim, Old Tappan, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/117,924

(22) Filed: Apr. 29, 2005

(65) Prior Publication Data

US 2006/0247880 A1 Nov. 2, 2006

(51) Int. Cl.
*G06F 3/02* (2006.01)

(52) U.S. Cl. ...................... 702/117; 702/176; 702/177; 702/190

(58) Field of Classification Search ................ 702/117, 702/120, 122, 35, 36, 57, 79, 176, 177, 190; 327/147
See application file for complete search history.

(56) References Cited

U.S. PATENT DOCUMENTS 5,118,975 A * 6/1992 Hillis et al. ................. 327/158
5,719,515 A * 2/1998 Danger ....................... 327/270
6,294,925 B1 * 9/2001 Chan et al. ................... 326/37
6,388,486 B1 * 5/2002 Schultz ....................... 327/170

OTHER PUBLICATIONS

Wang et al., New Efficient Designs for XOR and XNOR Functions on the Transistor Level ,Jul. 1994, IEEE Journal of Solid-State Circuits, vol. 29, 780-786.*
Alioto et al., Design of MUX, XOR and D-Latch SCL Gates, 2003, IEEE, 261-264.*

* cited by examiner

*Primary Examiner*—Marc S. Hoff
*Assistant Examiner*—Felix Suarez
(74) *Attorney, Agent, or Firm*—Duke W. Yee; Francis Lammes

(57) ABSTRACT

A testable digital delay line that uses XOR gates as delay elements is provided. The use of XOR gates enables independent control of each input to the multiplexer. With test inputs that enable each delay element, the multiplexer inputs can be assigned any value during test, thus giving the delay line very robust pattern fault coverage. The XOR gate may consist of three current limiting inverters. A reference voltage generator generates constant voltages between a source voltage, bias voltages, and ground. These constant voltages decide the amount of current through the current limiting inverters. Selecting a different set of reference voltages programs a different current flowing in the current limiting inverters. This programmable current causes a programmable unit delay to be introduced by each XOR gate delay element.

7 Claims, 3 Drawing Sheets

CONTROL
REFERENCE CURRENT GENERATOR
502
IREF
PBIAS AND NBIAS VOLTAGE GENERATOR
504
PBIAS
NBIAS
XOR
512
PBIAS
NBIAS
XOR
514
PBIAS
NBIAS
XOR
516

TESTABLE DIGITAL DELAY LINE

BACKGROUND OF THE INVENTION

1. Technical Field

The present invention relates to signal delay devices for integrated circuits and, in particular, to testability of digital delay lines.

2. Description of Related Art

Delay elements perform the function of delaying a signal in accordance with a control signal. For proper functioning of synchronous circuits, it is important for data to arrive at the right time relative to a clock signal. Due to process variations and other design constraints, this is not always the case. Digital delay lines are commonly employed to compensate for variations in design and fabrication. Digital delay lines provide a mechanism for adding a set amount of delay into the receipt of a signal.

As the chip sizes grow, the requirements for delay compensation also grow. These linear delay stepping devices occupy a huge amount of chip area and, therefore, are susceptible to structural defects during the manufacturing process. It is important and economical to be able to test for these structural faults very early in the production cycle of the chip. Currently delay lines are either not testable or are only partially testable at the wafer level using a static fault model.

A primary cause of non testability comes from a pattern fault model for the delay element selection multiplexer. A pattern fault model dictates that a wafer tester should be able to observe as well as independently control every input of a multiplexer. This is required because multiplexers are constructed using transmission gates wired together. Even when one of the inputs is selected, other another input might have an effect on the output based upon weak coupling due to an improperly manufactured device. These kinds of faults can only be detected when the test pattern generator creates a pattern that looks at the output when a first input is selected and varies the value of another input to check if the output has changed. If the devices have been manufactured properly, the output should not change.

Most current delay line circuits use a chain of delay elements, such as buffers or inverters, switched into or out of the signal path using a multiplexer. An input of logic value "1" into the delay line input will force a "1" on all inputs to the multiplexer. This is the expected operation during functional mode; however, during a static fault test at wafer level, this circuit cannot be tested for pattern faults. When a tester selects a first input of the multiplexer, the tester should also be able to vary the values of a second, third, or fourth input, for example, and check the effect on the output. This inability to verify the design for pattern faults reduces the testability coverage. Reduction in testability coverage leads to poor diagnostics in case of the lower yields.

SUMMARY OF THE INVENTION

The present invention recognizes the disadvantages of the prior art and provides a testable digital delay line that uses XOR gates as delay elements. The use of XOR gates enables independent control of each input to the multiplexer. With test inputs that enable each delay element, the multiplexer inputs can be assigned any value during test, thus giving the delay line very robust pattern fault coverage. The XOR gate may consist of three current limiting inverters. A reference voltage generator generates constant voltages between a source voltage, bias voltages, and ground. These constant voltages decide the amount of current through the current limiting inverters. Selecting a different set of reference voltages programs a different current flowing in the current limiting inverters. This programmable current causes a programmable unit delay to be introduced by each XOR gate delay element.

BRIEF DESCRIPTION OF THE DRAWINGS

The invention itself, as well as a preferred mode of use, further objectives and advantages thereof, will best be understood by reference to the following detailed description of an illustrative embodiment when read in conjunction with the accompanying drawings, wherein.

DETAILED DESCRIPTION OF THE PREFERRED EMBODIMENT

Figure 2:
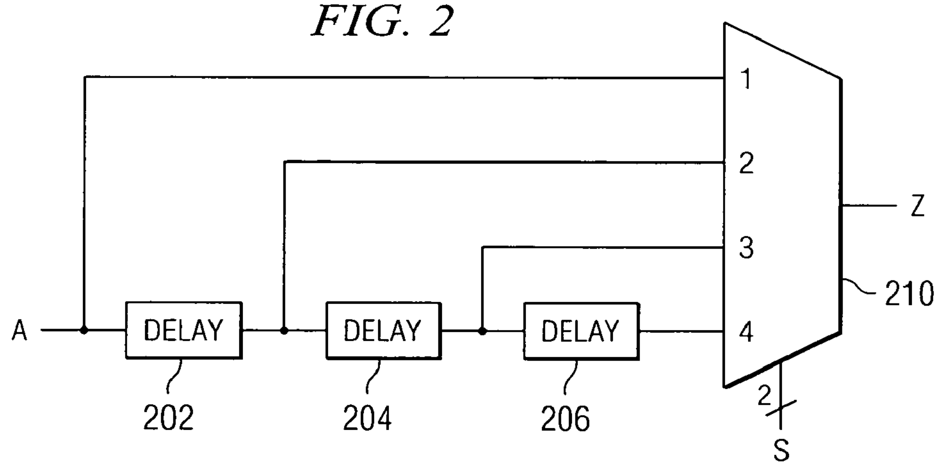
FIG. 2 illustrates an example digital delay line using a chain of delay elements in accordance with exemplary aspects of the present invention.
Figure 3:
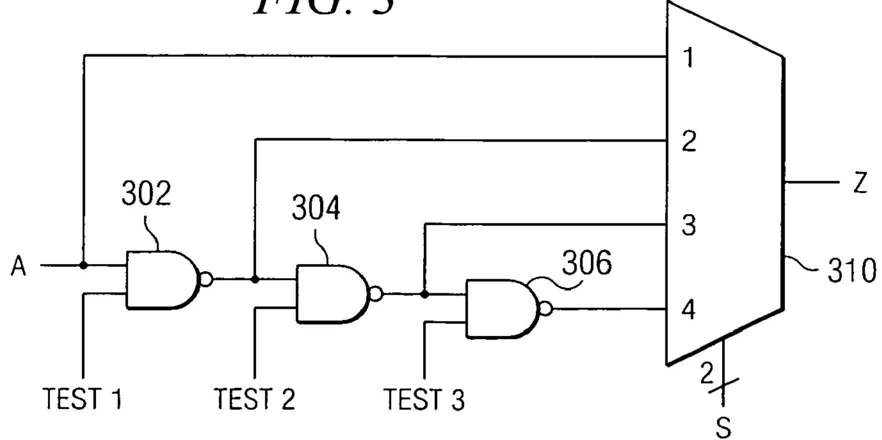
FIG. 3 depicts a digital delay line using NAND gates as delay components.

A method and apparatus for providing a testable delay line are provided. The following FIGS. 1–3 are provided as exemplary diagrams of important aspects of digital delay lines to which the exemplary aspects of the present invention may be applied. It should be appreciated that FIGS. 1–3 are only exemplary and are intended only to illustrate the aspects of digital delay lines to which the exemplary aspects of the present invention may be applied. Many modifications to digital delay line environments may be made without departing from the spirit and scope of the exemplary embodiments described herein.

Figure 1A:
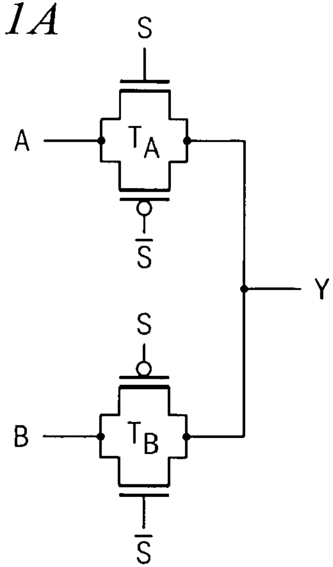
FIGS. 1A and 1B are pictorial representations of a multiplexer constructed using transmission gates wired together to which the exemplary aspects of the present invention may be applied.
Figure 1B:
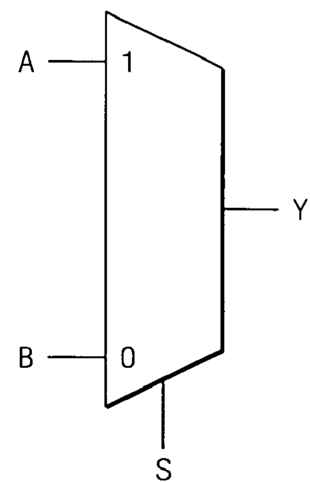

With reference now to the figures and in particular with reference to FIGS. 1A and 1B, a pictorial representation of a multiplexer constructed using transmission gates wired together to which the exemplary aspects of the present invention may be applied. As shown in FIG. 1A, input A is connected to transmission gate $T_A$ and input B is connected to transmission gate $T_B$. Selection signal, S, is also connected to transmission gates $T_A$ and $T_B$, as well as the inverse of the selection signal. When S is asserted, input A is provided to output Y. When S is deasserted, input B is provided to output Y.

Even when one of the inputs, say A, is selected, the other input, B, might have an effect on the output based upon weak coupling due to improperly manufactured device. These kind of faults can only be detected when the test pattern generator creates a pattern that looks at the output Y when for example S=1 (i.e. input A is selected) and varies the value of input B to check if the output changed. If the devices $T_A$ and $T_B$ have been manufactured properly, the output should not change.

FIG. 2 illustrates an example digital delay line using a chain of delay elements in accordance with exemplary aspects of the present invention. When an input is provided at A, the signal is immediately available at input 1 of multiplexer 210. After the signal passes through delay element 202, the signal is available at input 2 of multiplexer 210. After the signal passes through delay element 202 and delay element 204, the signal is available at input 3 of multiplexer 210. Then, after the signal passes through delay element 202, delay element 204, and delay element 206, the signal is available at the input 4 of multiplexer 210. Selection signal, S, determines which input is passed to output Z.

Many prior art delay line circuits use buffers or inverters as the delay elements. An input of logic value "1" into the delay line input A will force a "1" on all inputs to the multiplexer. This is the expected operation during functional mode; however, during a static fault test at wafer level, this circuit cannot be tested for pattern faults. When control signal S selects input 1 of the multiplexer, it should be able to vary the values of inputs 2, 3, and 4 and check the effect on the output. This inability to verify the design for pattern faults reduces the testability coverage. Reduction in testability coverage leads to poor diagnostics in case of the lower yields.

One prior art solution uses a NAND gate instead of an inverter or buffer as a delay element. FIG. 3 depicts a digital delay line using NAND gates as delay components. S[0] and S[1] are two select lines to choose one of the four inputs to multiplexer, thus programming the amount of delay introduced in the signal path from input A to output Z. Input Test 1 is applied to NAND gate 302 and allows a tester to enable or disable delay element 302 to test how delay element 302 affects the output of multiplexer 310. Input Test 2 is applied to NAND gate 304 and allows the tester to enable or disable delay element 304 to test how delay element 304 affects the output of multiplexer 310. Input Test 3 is applied to NAND gate 306 and allows a tester to enable or disable delay element 306 to test how delay element 306 affects the output of multiplexer 310.

However, the test inputs to the NAND gates can only force a "0" output. When S="00," input 1 of multiplexer 310 is selected. If delay line input A="0," the input 1 to multiplexer 310 is "0," which forces input 2 of multiplexer 310 to "1" irrespective of the value taken by Test 1. Thus, when S="00" and A="0," input 2 of multiplexer 310 cannot be changed to "0," and the pattern fault model cannot be fully exercised, reducing the test coverage.

Figure 4:
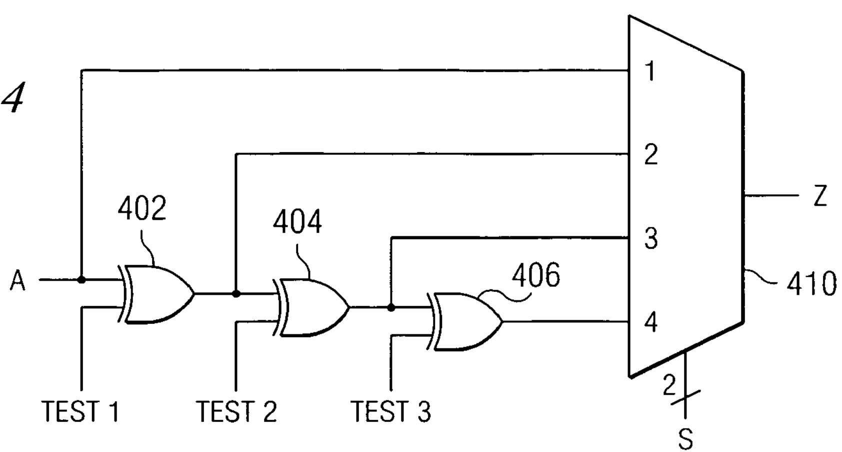
FIG. 4 depicts a digital delay line using XOR gates as delay components in accordance with exemplary aspects of the present invention.

In accordance with exemplary aspects of the present invention, a testable digital delay line is provided that uses XOR gates as delay elements. The use of an XOR gate as a delay element is not limited to this implementation of a delay line but can be trivially extended to other delay line architectures by replacing the delay element (inverter, buffer or NAND gate) with an XOR gate. FIG. 4 depicts a digital delay line using XOR gates as delay components in accordance with exemplary aspects of the present invention. S[0] and S[1] are two select lines to choose one of the four inputs to multiplexer, thus programming the amount of delay introduced in the signal path from input A to output Z. Input Test 1 is applied to XOR gate 402 and allows a tester to enable or disable delay element 402 to test how delay element 402 affects the output of multiplexer 410. Input Test 2 is applied to XOR gate 404 and allows the tester to enable or disable delay element 404 to test how delay element 404 affects the output of multiplexer 410. Input Test 3 is applied to XOR gate 406 and allows a tester to enable or disable delay element 406 to test how delay element 406 affects the output of multiplexer 410.

Use of an XOR gate enables independent control of each input to the multiplexer.

The test inputs may be held to value of "0" during functional mode. The test inputs may be varied to any value ("0" or "1") during manufacturing test mode. Now with test inputs Test 1, Test 2, and Test 3, the multiplexer inputs can be assigned any value during test, thus giving the delay line very robust pattern fault coverage.

Figure 5:
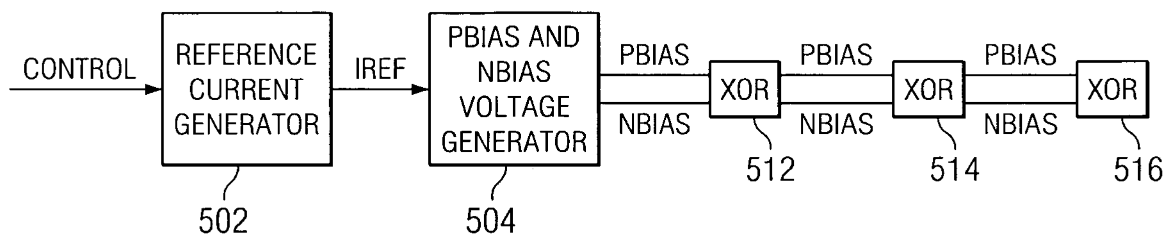
FIG. 5 is a block diagram illustrating a reference voltage generator for XOR gates in a digital delay line in accordance with exemplary aspects of the present invention.

There are several other properties an XOR gate must have to be used as a delay element. Using an XOR gate as a delay element requires use of a reference voltage generator. FIG. 5 is a block diagram illustrating a reference voltage generator for XOR gates in a digital delay line in accordance with exemplary aspects of the present invention. Reference current generator 502 receives a control signal and generates reference current, Iref. Voltage generator 504 receives Iref and generates reference voltages pbias and nbias. The reference voltages are provided to XOR gates 512, 514, 516. Reference voltage generator 504 can generate constant voltages between a source voltage, pbias, nbias, and ground.

Figure 6:
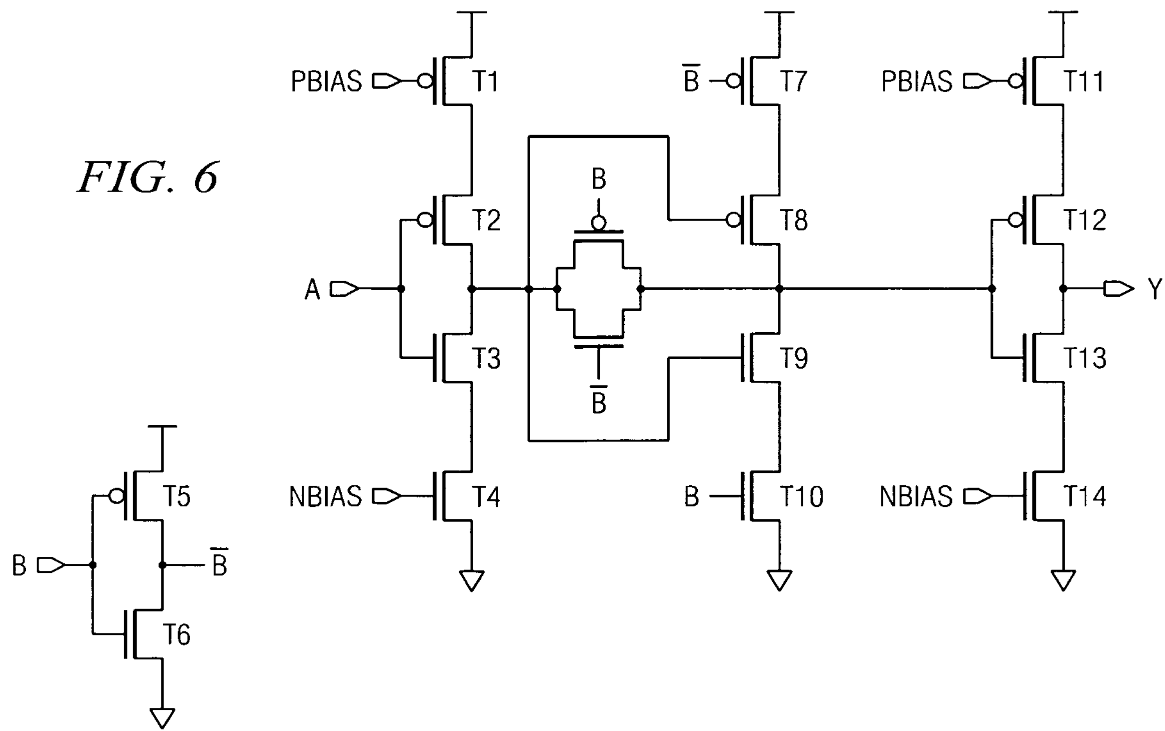
FIG. 6 illustrates an example of an XOR gate in accordance with exemplary embodiments of the present invention.

FIG. 6 illustrates an example of an XOR gate in accordance with exemplary embodiments of the present invention. Input A is applied to transistors T2 and T3. Transistors T5 and T6 form an inverter to form the inverse of B. Input B is applied to transistor T7 and the inverse of B is applied to transistor T10. The output, Y, of the circuit shown in FIG. 6 is A XOR B. Thus, the input signal of the digital delay line may be provided to A and a test input may be provided to B. In functional mode, B, for example, may be set to "0," in which case the output will follow A. However, when testing the digital delay line, B may be set to the opposite of the value of input A to force an incorrect value. In this way, the tester may determine the effect of an incorrect value on the output of the digital delay line.

Transistors T1–T4, transistors T7–T10, and transistors T11–T14 form three sets of current limiting inverters. Generating a set of reference voltages, pbias and nbias, causes a particular current to flow through the current limiting inverters. The pbias reference voltage is applied to transistors T1 and T11. The nbias reference voltage is applied to transistors T4 and T14. This programmable current causes a programmable unit delay to be introduced by each XOR gate delay element. The inverter formed by T5 and T6 is not a current limiting inverter because this path is only used for testing and not for the delay element in functional mode.

The reference voltage generator generates fixed bias voltages for these current limiting inverters giving supply noise rejection capability. Stated in terms of slew rate, varying current through current limiting inverters changes slew rate of the signal passing from A to Y, thus varying the propagation delay. As slew rate decides the power consumption in complementary metal oxide semiconductor (CMOS) devices, one can program an optimum slew rate through the XOR gate for a given range of frequencies by programming the current through the limiting inverters. Thus the XOR circuit shown in FIG. 6 has another advantage of being able to save power. Another advantage of using a current limiting inverter in the XOR gate is that it effectively increases the impedance at the current supply nodes for switching transistors. This increases the power-supply noise rejection capability, which is an important factor in a delay line.

Figure 7:
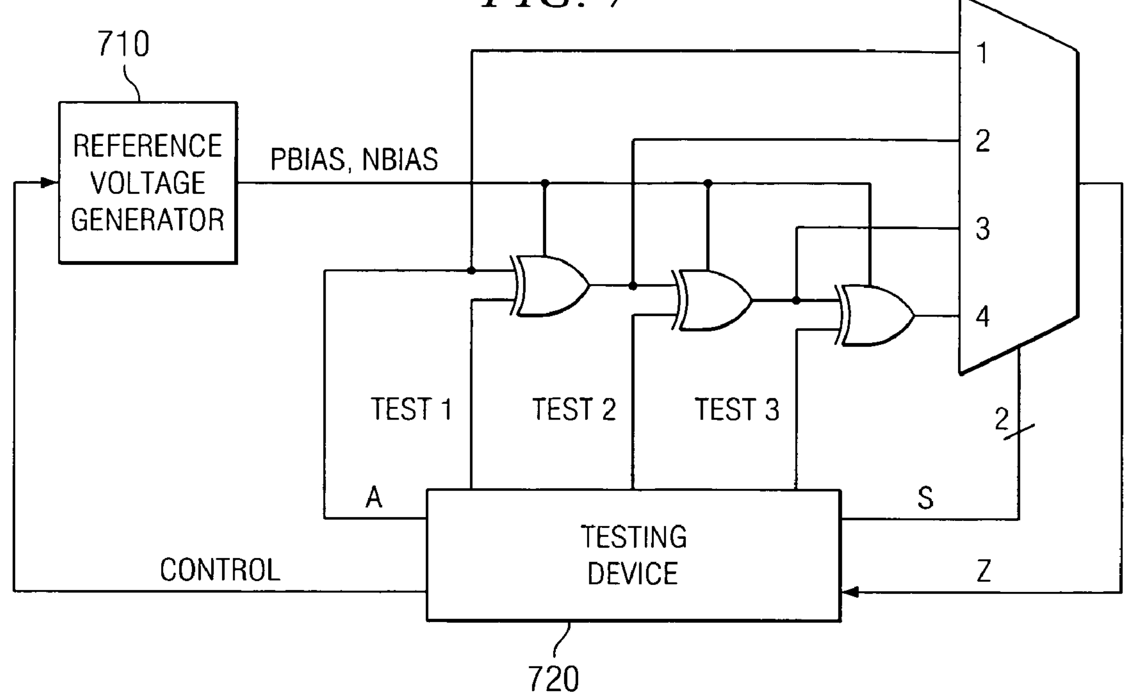
FIG. 7 illustrates a testing environment with a testable digital delay line in accordance with exemplary aspects of the present invention.

FIG. 7 illustrates a testing environment with a testable digital delay line in accordance with exemplary aspects of the present invention. Reference voltage generator 710 generates reference voltages, pbias and nbias, based on a control signal from testing device 720. Testing device 720 also sets delay line input A, test inputs Test 1, Test 2, and Test 3, and multiplexer selection signals S. Testing device 720 then records results from Z.

Figure 8:
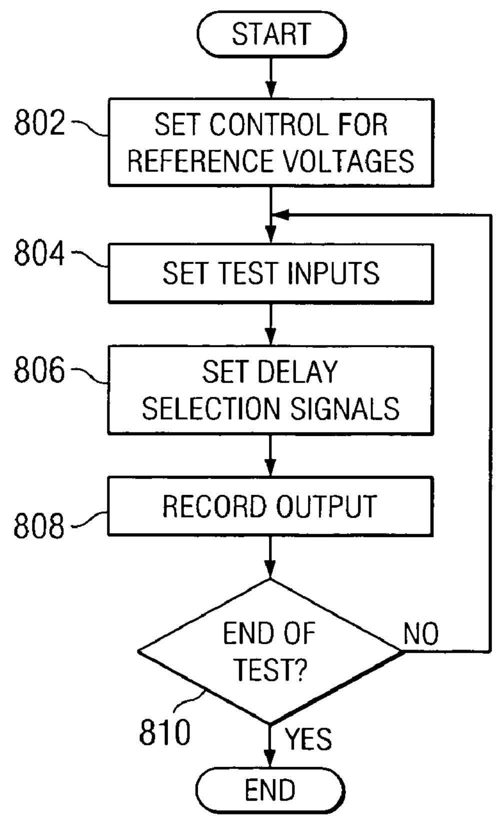
FIG. 8 is a flowchart illustrating operation of testing a digital delay line in accordance with exemplary aspects of the present invention.

FIG. 8 is a flowchart illustrating operation of testing a digital delay line in accordance with exemplary aspects of the present invention. Operation begins and the tester sets a control for generating reference voltages for the current limiting converters in the XOR gates in the digital delay line (block 802). Then, the tester sets the test inputs, which include the input to the digital delay line and the inputs that enable or disable the XOR gate elements (block 804). Next, the tester sets the delay selection signals (block 806) and records the output (block 808). The tester determines whether the end of the test is reached (block 810). If the desired testing coverage is achieved or the test is otherwise ended, operation ends. If the end of the test is not reached in block 810, operation returns to block 804 to set the next test inputs.

Thus, the present invention solves the disadvantages of the prior art by providing a testable digital delay line. The testable digital delay line uses XOR gates as delay elements. The use of XOR gates enables independent control of each input to the multiplexer. With test inputs that enable each delay element, the multiplexer inputs can be assigned any value during test, thus giving the delay line very robust pattern fault coverage. The XOR gate may consist of three current limiting inverters. A reference voltage generator generates constant voltages between a source voltage, bias voltages, and ground. These constant voltages decide the amount of current through the current limiting inverters. Selecting a different set of reference voltages programs a different current flowing in the current limiting inverters. This programmable current causes a programmable unit delay to be introduced by each XOR gate delay element The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A testable digital delay line, comprising:

a delay line input signal;

a plurality of XOR gate delay elements, wherein a first XOR gate delay element within the plurality of XOR gate delay elements receives the delay line input, wherein the plurality of XOR gate delay elements are connected in series through a first input, and wherein each XOR gate delay element receives a test signal at a second input; and a multiplexer, wherein the multiplexer receives the delay line input signal at a first input and receives a delayed version of the delay line input signal from an output of each XOR gate delay element at each subsequent input, wherein each XOR gate delay element includes three sets of current limiting inverters and, wherein the three sets of current limiting inverters optimize slew rate.

2. The testable digital delay line of claim 1, further comprising:

a voltage generator that provides at least one bias voltage to at least one of the three sets of current limiting inverters.

3. The testable digital delay line of claim 2, further comprising:

a reference current generator that provides a reference current to the voltage generator, wherein the voltage generator generates the at least on bias voltage based on the reference current.

4. The testable digital delay line of claim 1, wherein the at least one bias voltage programs a unit delay to be introduced by each XOR gate delay element.

5. The testable digital delay line of claim 1, wherein the three sets of current limiting inverters reject power supply noise.

6. The testable digital delay line of claim 1, wherein the three sets of current limiting inverters increase impedance seen at current supply nodes of each XOR gate delay element.

7. The testable digital delay line of claim 1, wherein altering current in the three sets of current limiting inverters varies delay through each XOR gate delay element.

* * * * *